(12) United States Patent
Sun

(10) Patent No.: US 8,632,046 B2
(45) Date of Patent: Jan. 21, 2014

(54) MOUNTING APPARATUS FOR FAN

(75) Inventor: Zheng-Heng Sun, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 0 days.

(21) Appl. No.: 13/593,535

(22) Filed: Aug. 24, 2012

(65) Prior Publication Data

US 2013/0320188 A1 Dec. 5, 2013

(30) Foreign Application Priority Data

May 31, 2012 (CN) .......................... 2012 1 0175210

(51) Int. Cl.
  *F01D 25/26* (2006.01)
  *F01D 25/28* (2006.01)
  *F03B 1/00* (2006.01)
  *B63H 1/28* (2006.01)

(52) U.S. Cl.
  USPC ........ 248/674; 415/213.1; 415/220; 415/189; 415/190; 415/60; 415/214.1; 416/244 R; 417/423.14; 417/423.9; 361/679.01; 361/679.47; 361/679.48; 361/695

(58) Field of Classification Search
  USPC ......... 248/674; 415/213.1, 220, 189, 190, 60, 415/214.1; 411/15, 110, 502; 416/244 R; 417/423.14, 423.9; 16/79; 361/679.01, 361/679.47, 679.48, 695
  See application file for complete search history.

(56) References Cited

U.S. PATENT DOCUMENTS

| | | | |
|---|---|---|---|
| 7,731,477 B2 * | 6/2010 | Erni | 415/126 |
| 8,366,417 B2 * | 2/2013 | Fan et al. | 417/423.14 |
| 2008/0112806 A1 * | 5/2008 | Fan et al. | 415/213.1 |
| 2008/0145246 A1 * | 6/2008 | Lee et al. | 417/423.14 |
| 2012/0138262 A1 * | 6/2012 | Zhang et al. | 165/67 |
| 2013/0045108 A1 * | 2/2013 | Zhou et al. | 416/244 R |

* cited by examiner

Primary Examiner — Terrell McKinnon
Assistant Examiner — Christopher Garft
(74) Attorney, Agent, or Firm — Altis Law Group, Inc.

(57) ABSTRACT

A mounting apparatus for a fan includes a bracket, two fixing members, two screws, and a shield plate. The bracket includes a fixing plate defining a vent and two first through holes adjacent to opposite ends of a top of the vent. The screws extend through the fixing members and the first through holes of the bracket, in that order, for engaging in an upper portion of the fan arranged behind the fixing plate, with the vent aligning with the fan. A top of the shield plate is rotatably connected between the fixing members. The shield plate hangs vertically by gravity to cover the vent upon a condition that the gravity of the shield plate is not overcome by airflow passing through the vent.

4 Claims, 2 Drawing Sheets

MOUNTING APPARATUS FOR FAN

BACKGROUND

1. Technical Field

The present disclosure relates to an apparatus for mounting a fan.

2. Description of Related Art

In an electronic device, fans are mounted to a bracket for dissipating heat from electronic components in the electronic device. However, when a fan is broken or not mounted, air pressure in the electronic device changes, which will cause turbulence and air to back flow, adversely influencing heat dissipation for the electronic device.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one."

Figure 1:
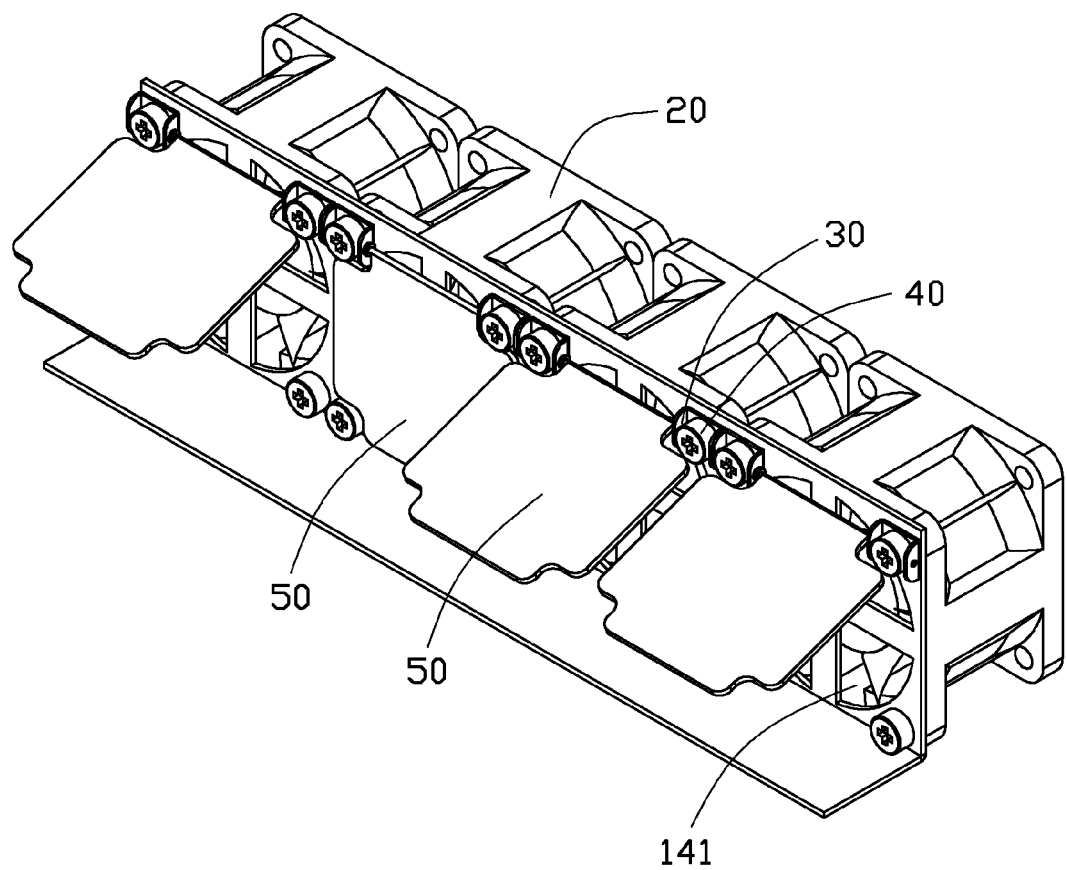
FIG. 1 is an assembled, isometric view of a mounting apparatus together with a plurality of fans.
Figure 2:
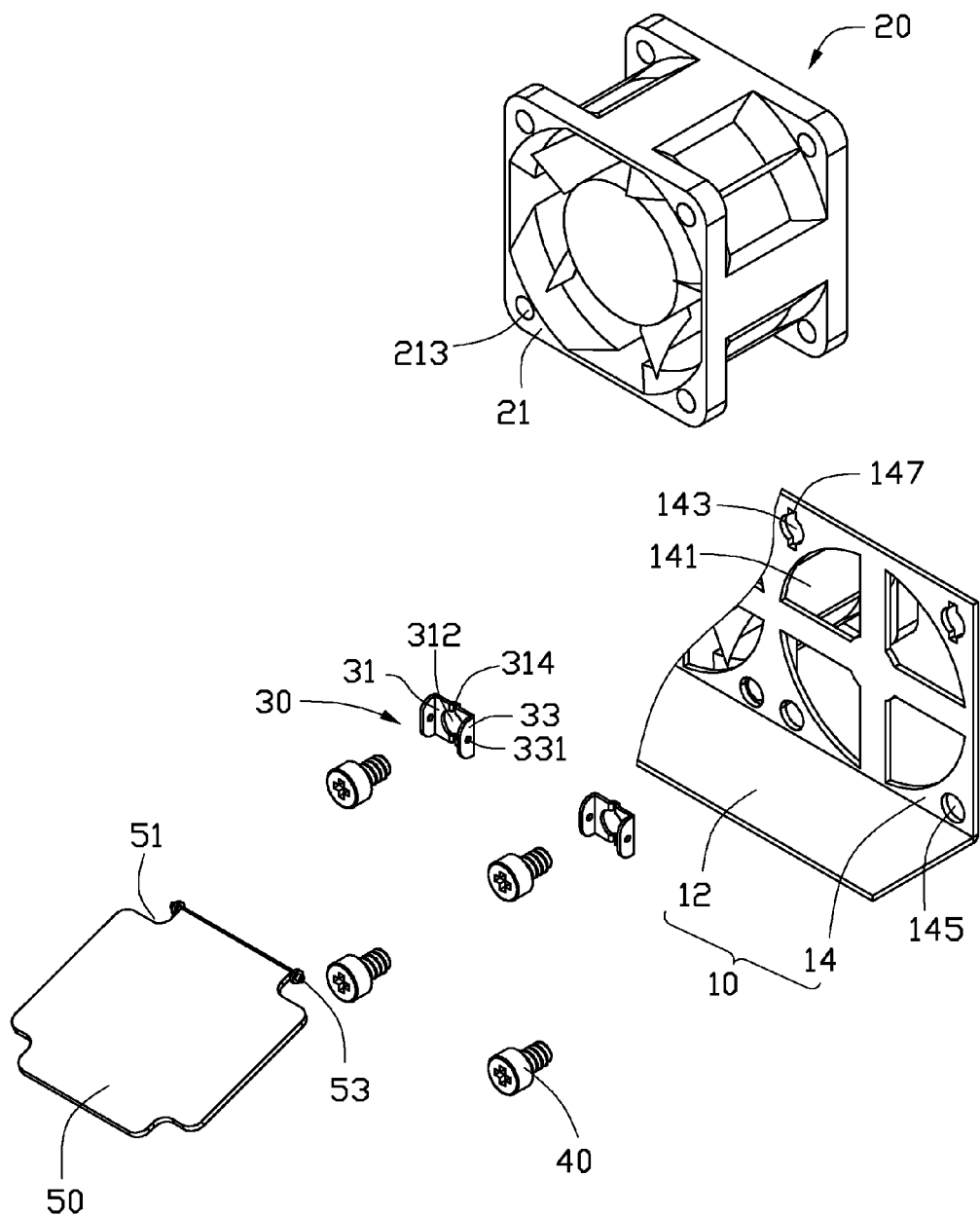
FIG. 2 is a partial, exploded, isometric view of FIG. 1.

Referring to FIGS. 1 and 2, an embodiment of a mounting apparatus for a plurality of fans 20 is shown. The mounting apparatus includes a bracket 10, four pairs of fixing members 30, eight pairs of screws 40, and four substantially rectangular shield plates 50.

Each fan 20 includes two opposite side plates 21. Four fixing holes 213 are defined in four corners of each side plate 21.

The bracket 10 includes an elongated base 12, and a substantially rectangular fixing plate 14 extending upwards from a rear side of the base 12 in a substantially perpendicular manner. Four vents 141 are defined in the fixing plate 14, arranged in a horizontal direction. Two first through holes 143 are defined in the fixing plate 14 adjacent to opposite ends of the top of each vent 141, and two second through holes 145 are defined in the fixing plate 14 adjacent to opposite ends of the bottom of each vent 141. Two opposite slots 147 are vertically defined in the fixing plate 14, respectively at the top side and the bottom side of each first through hole 143, communicating with the first through hole 143.

Each fixing member 30 includes a sidewall 31, and two arms 33 extending forward from opposite ends of the sidewall 31 in a substantially perpendicular manner. A third through hole 312 is defined in the sidewall 31. Two vertically extending protrusions 314 protrude backward from the sidewall 31, and are respectively arranged over and under the third through hole 312. A pivot hole 331 is defined in each arm 33.

Four notches 51 are defined in four corners of each shield plate 50. Two pivots 53 protrude from opposite ends of the top side of each shield plate 50, extending toward two corresponding notches 51.

To assemble a fan 20 to the mounting apparatus, one of the side plates 21 abuts the rear side of the fixing plate 14, to allow the fixing holes 213 of the side plate 21 to align with two first through holes 143 and two second through holes 145 around one of the vents 141. A pair of screws 40 are extended through the two second through holes 145 and engaged in two fixing holes 213 at a lower section of the side plate 21. Another pair of screws 40 extend through the third through holes 312 of a pair of fixing members 30 and the two first through holes 143 in that order, and then engage in two fixing holes 213 at an upper section of the side plate 21. Thereby, the fan 20 is fastened to the fixing plate 14 and aligns with the vent 141. The protrusions 314 of the pair of fixing members 30 engage in the slots 147 around the two first through holes 143, to lock the fixing members 30 to the fixing plate 14 immovably. The pivot holes 331 of the two fixing members 30 are arranged on a horizontal line.

The other fans 20 are mounted to the mounting apparatus using the same manner, with each vent 141 aligning with a fan 20.

The four shield plates 50 are mounted right ahead of the four vents 141, to allow the pivots 53 of each shield plate 50 to rotatably engage in the pivot holes 331 of two fixing members 30 adjacent to opposite ends of the corresponding vent 141. The shield plates 50 hang vertically by gravity, allowing each vent 141 to be covered by one shield plate 50. The fixing members 30 and the screws 40 are partially received in the notches 51.

When the fans 20 operate, airflow from the fans 20 passes through the corresponding vents 141 and is blown towards the shield plates 50 right ahead of the fans 20. The shield plates 50 rotate forward 90 degrees around the corresponding pivots 53, to allow the airflow produced by the fans 20 to pass through.

Before a replacement of a broken fan 20 is completed, the shield plate 50 right in front of the broken fan 20 vertically covers the corresponding vent 141 by means of gravity. Air pressure at the vertical shield plate 50 will not change substantially, so the vertical shield plate 50 can prevent air from flowing back towards the broken fan 20.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A mounting apparatus for a fan, comprising:
   a bracket comprising a fixing plate defining a vent and two first through holes adjacent to opposite ends of a top of the vent;
   two fixing members;
   two screws extending through the fixing members and the first through holes of the bracket, in that order, for engaging in an upper portion of the fan arranged behind the fixing plate, with the vent aligning with the fan; and
   a shield plate with a top of the shield plate rotatably connected between the fixing members, wherein the shield plate hangs vertically by gravity to cover the vent upon a condition that the gravity of the shield plate is not overcome by airflow passing through the vent, and
   wherein each fixing member comprises a sidewall abutting a front side of the fixing plate, and an arm extending forward from an end of the sidewall adjacent to the opposite fixing member in a substantially perpendicular manner, a second through hole is defined in each sidewall through which a corresponding screw extends, opposite ends of the top of the shield plate are rotatably connected to the arms of the fixing members, two slots are defined in the fixing plate, respectively at opposite sides of each first through hole, and two protrusions protrude backward from the sidewall of each fixing member at opposite sides of the corresponding second through hole, the protrusions engage in the corresponding slots, to lock the fixing members to the fixing plate.

2. The mounting apparatus of claim 1, wherein the fixing plate further defines two second through holes adjacent to opposite ends of a bottom of the vent, the mounting apparatus further comprises two screws extending through the second through holes, for engaging in a lower portion of the fan.

3. The mounting apparatus of claim 2, wherein the shield plate is substantially rectangular, and four notches are defined in four corners of the shield plate.

4. The mounting apparatus of claim 1, wherein each arm defines a pivot hole, two pivots protrude from the opposite ends of the top of the shield plate, to rotatably engage in the pivot holes of the arms.

\* \* \* \* \*